United States Patent [19]
Jo

[11] Patent Number: 6,101,144
[45] Date of Patent: Aug. 8, 2000

[54] INTEGRATED CIRCUIT MEMORY DEVICES HAVING AUTOMATICALLY INDUCED STANDBY MODES AND METHODS OF OPERATING SAME

[75] Inventor: Seong-kue Jo, Kyungki-do, Rep. of Korea

[73] Assignee: Samsung Electronics Co., Ltd., Rep. of Korea

[21] Appl. No.: 09/318,187

[22] Filed: May 25, 1999

[30] Foreign Application Priority Data

May 25, 1998 [KR] Rep. of Korea ...................... 98-18827

[51] Int. Cl.[7] ..................................................... G11C 7/00
[52] U.S. Cl. ........................... 365/229; 365/227; 365/233
[58] Field of Search .................................. 365/227, 228, 365/229, 233, 233.5

[56] References Cited

U.S. PATENT DOCUMENTS 5,371,709  12/1994  Fisher et al. .............................. 365/226
5,521,878  5/1996  Ohtani et al. ............................ 365/233
5,926,434  7/1999  Mori ......................................... 365/233

Primary Examiner—Son Mai
Attorney, Agent, or Firm—Myers Bigel Sibley & Sajovec

[57] ABSTRACT

Integrated circuit memory devices monitor clock signal transitions and automatically induce a power saving standby mode of operation if the clock signal becomes inactive for a designated amount of time. The memory devices include at least one buffer having an active mode and an inactive standby mode and a standby current control circuit. This control circuit disposes the at least one buffer in its inactive standby mode whenever a power down signal is in a first logic state or whenever the power down signal is in a second logic state at a point in time when a clock signal has continuously been in an inactive state for a duration greater than twice its period. The control circuit may comprise a clock signal detector having N serially-connected latches therein which are reset whenever the clock signal transitions from the inactive state to an active state. The clock signal detector is responsive to the power down signal and comprises an oscillator which is active whenever the power down signal is in the second logic state and inactive whenever the power down signal is in the first logic state.

19 Claims, 3 Drawing Sheets

6,101,144

INTEGRATED CIRCUIT MEMORY DEVICES HAVING AUTOMATICALLY INDUCED STANDBY MODES AND METHODS OF OPERATING SAME

RELATED APPLICATION

This application is related to Korean Application No. 98-18827, filed May 25, 1998, the disclosure of which is hereby incorporated herein by reference.

1. Field of the Invention

The present invention relates to integrated circuit devices, and more particularly to integrated circuit memory devices and methods of operating integrated circuit memory devices.

2. Background of the Invention

Notwithstanding recent advances in developing more highly integrated semiconductor devices, the increasing use of battery powered computer and communication systems has required the development of devices having substantially reduced power consumption requirements. To reduce the power consumption requirements of synchronous DRAM devices (which may contain TTL buffers having relatively high current requirements when active), power down signals have been utilized to induce a power saving standby mode during time periods when one or more devices need not be active. However, because devices such as TTL buffers may remain active in SDRAMs whenever a clock enable signal (CKE) is active, even if the buffers are not actively buffering data, there is a continuing need to develop additional techniques to reduce power consumption requirements in devices which may be battered powered.

SUMMARY OF THE INVENTION

It is therefore an object of the present invention to provide improved integrated circuit memory devices and methods of operating same.

It is another object of the present invention to provide integrated circuit memory devices having reduced power consumption requirements and methods of operating same.

These and other objects, advantages and features of the present invention are provided by integrated circuit memory devices which monitor clock signal transitions and automatically induce a power saving standby mode of operation if the clock signal becomes inactive for a designated amount of time. According to an embodiment of the present invention, an integrated circuit memory device is provided which comprises at least one buffer having an active mode and an inactive standby mode and a standby current control circuit. This control circuit disposes the at least one buffer in its inactive standby mode whenever a power down signal is in a first logic state or whenever the power down signal is in a second logic state at a point in time when a clock signal has continuously been in an inactive state for a duration greater than twice its period. The control circuit may comprise a clock signal detector having N serially-connected latches therein which are reset whenever the clock signal transitions from the inactive state to an active state. The clock signal detector is responsive to the power down signal and comprises an oscillator which is active whenever the power down signal is in the second logic state and inactive whenever the power down signal is in the first logic state. A NOR gate is also provided. The NOR gate has a first input electrically coupled to an output of the oscillator, a second input electrically coupled to an output of one of the N serially-connected latches and an output electrically coupled to an input of another of the N serially-connected latches.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 1:
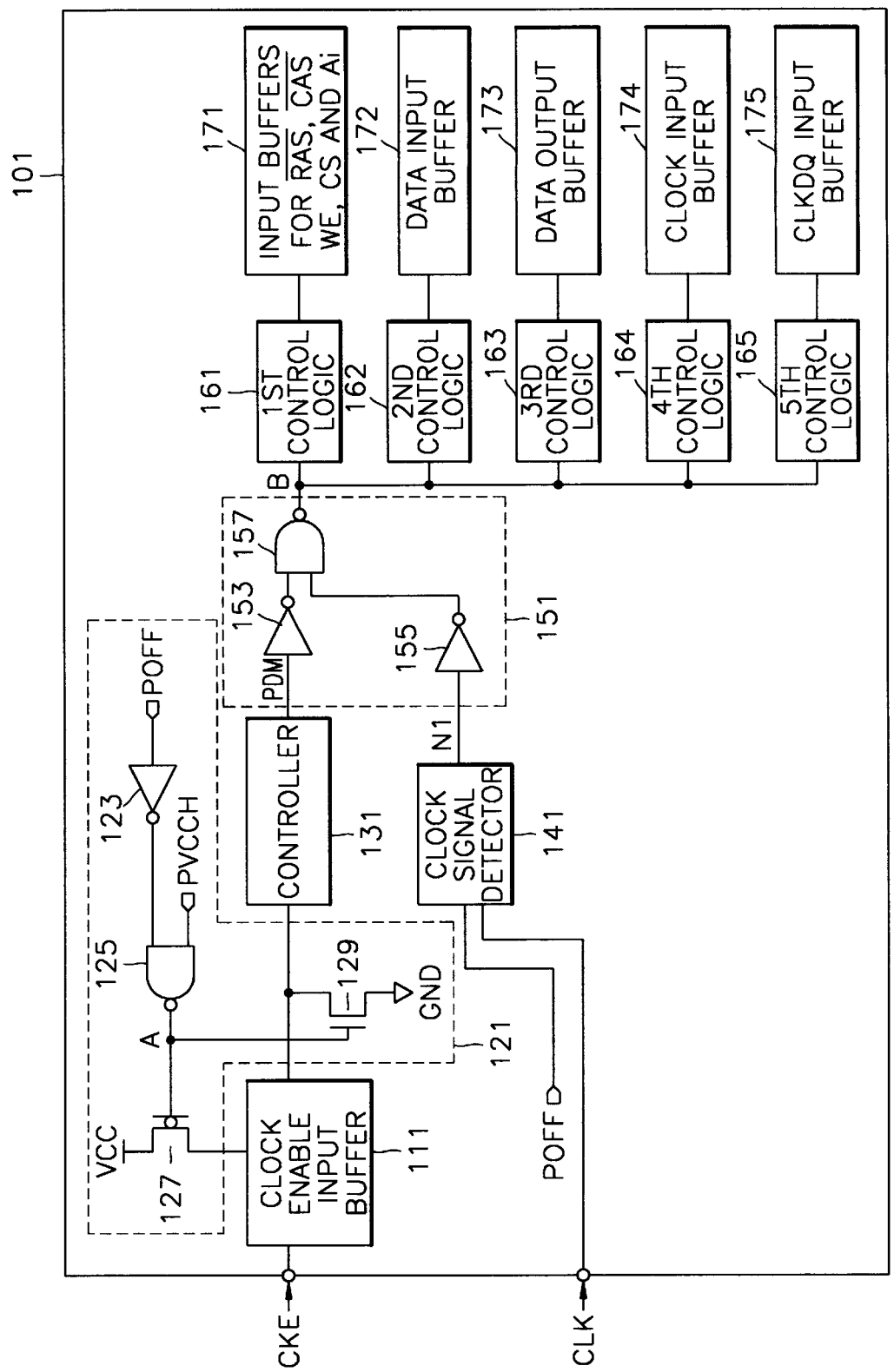
FIG. 1 is an electrical schematic of an integrated circuit memory device according to an embodiment of the present invention.

Referring now to FIG. 1, a preferred integrated circuit memory device 101 (e.g., SDRAM) according to an embodiment of the present invention is illustrated. This memory device includes a clock enable input buffer 111 which receives a clock enable signal CKE (e.g., at a TTL voltage level) and passes this clock enable signal CKE to a controller 131 (e.g., at a CMOS voltage level) when a power supply signal Vcc is supplied via PMOS transistor 127. As illustrated, PMOS transistor 127 will be turned on whenever the output of NAND gate 125 is driven to a logic 0 potential (i.e., node A=0). The output of NAND gate 125 will be driven to a logic 0 potential whenever both inputs of the NAND gate 125 receive logic 1 signals. Thus, as illustrated, the PMOS transistor 127 will be turned on whenever the power down signal POFF is at a logic 0 potential and the power voltage detection signal PVCCH is at a logic 1 potential. According to an aspect of this embodiment, the power voltage detection signal PVCCH will be set to a logic 1 potential if the magnitude of the power supply potential Vcc exceeds a threshold potential and will be set to a logic 0 potential if the magnitude of the power supply potential Vcc is below the threshold potential.

However, the clock enable signal CKE will not be passed to the controller 131 if node A at the output of NAND gate 125 is set to a logic 1 potential because NMOS pull-down transistor 129 will be turned on and thereby clamp the output of the clock enable input buffer 111 at a logic 0 potential. The PMOS pull-up transistor 127, NAND gate 125, inverter 123 and NMOS pull-down transistor 129 collectively form a first logic circuit 121, as illustrated. The controller 131 generates a power down mode signal PDM at a logic 1 potential if node A is set to a logic 1 potential. Accordingly, a logic 1 power down signal POFF (indicating a standby mode) or a logic 0 power voltage detection signal PVCCH (indicating a low Vcc potential) will cause the power down mode signal PDM to be set to a logic 1 potential. Otherwise, if node A is set to a logic 0 potential, the output of the controller 131 will be influenced by the value of the output of the clock enable input buffer 111.

Inverter 153 converts a logic 1 power down mode signal PDM to a logic 0 potential at an input of NAND gate 157. This logic 0 potential at an input of the NAND gate 157 also translates into a logic 1 potential at the output of the NAND gate 157 (i.e., node B). When the output of the NAND gate 157 is set to a logic 1 potential, the first, second, third, fourth and fifth control logic circuits 161–165 generate outputs which disable their respective buffers. The buffers include: row address strobe (/RAS) buffer, column address strobe (/CAS) buffer, write enable (WE) buffer, chip select (CS) buffer and address (Ai) buffer collectively shown as buffers 171, data input buffer 172, data output buffer 173, clock input buffer 174 and CLKDQ input buffer 175. Thus, regardless of the value of the clock enable signal CKE, the generation of a logic 1 power down signal POFF or a logic 0 power voltage detection signal PVCCH will result in the generation of a logic 1 potential at node A, a logic 1 power down mode PDM signal and a logic 1 potential at node B. Stated alternatively, the generation of a logic 1 power down signal POFF or a logic 0 power voltage detection signal PVCCH will cause the buffers 171–175 to become inactive in a reduced power standby mode.

In addition, according to a preferred aspect of the present invention, even when the power down signal POFF is at a logic 0 potential (thereby indicating normal operating mode), the buffers 171–175 can still be driven into respective standby modes if the clock signal CLK becomes inactive for a specified duration. When these events occur, node N1 at the output of the clock signal detector 141 will be driven to a logic 1 potential and cause the output of the inverter 155 to be driven to a logic 0 potential. This, in turn, will cause the output of NAND gate 157 to be driven to a logic 1 potential and thereby automatically induce a standby mode of operation in buffers 171–175. Here, inverters 153 and 155 and NAND gate 157 collectively form a second logic circuit 151.

Figure 2:
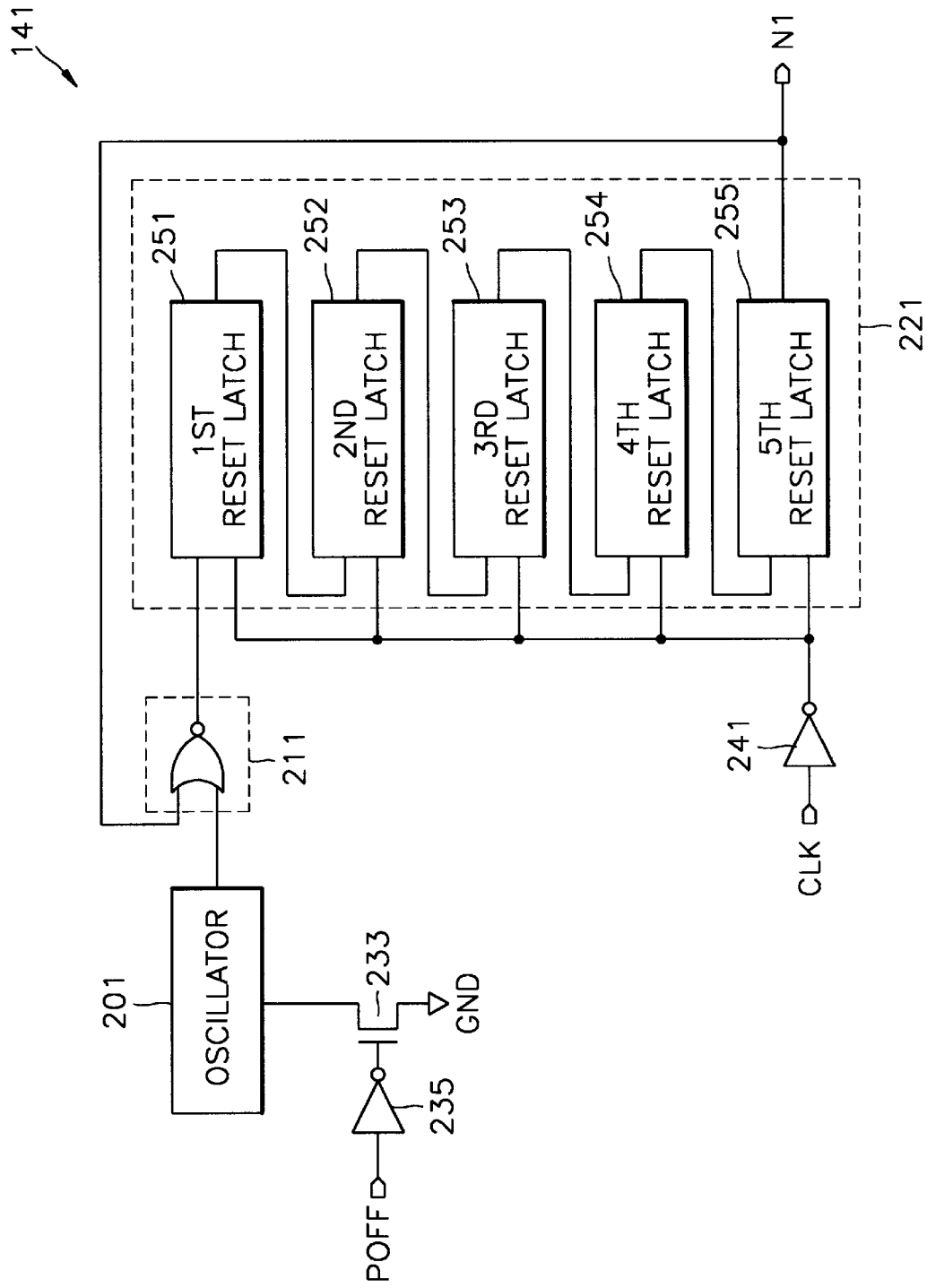
FIG. 2 is an electrical schematic of a preferred clock signal detector, according to the embodiment of FIG. 1.
Figure 3:
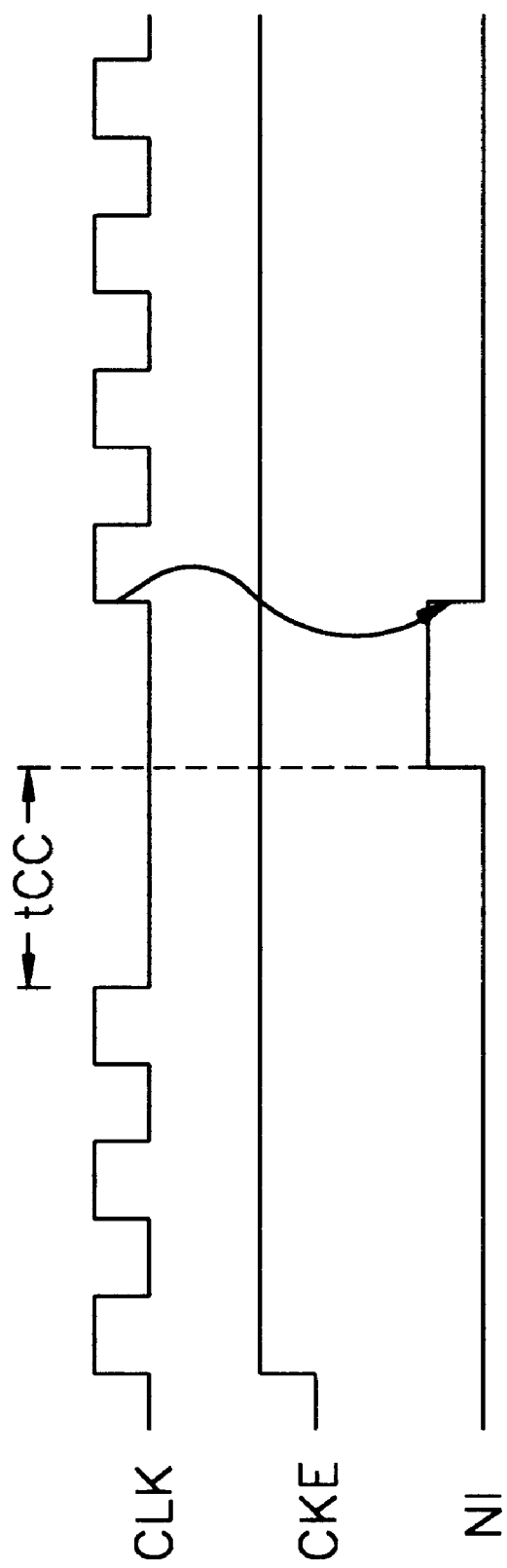
FIG. 3 is a timing diagram which illustrates operation of the memory device of FIG. 1.

As more fully illustrated by FIG. 2, this automatic inducement of a standby mode whenever the clock signal CLK becomes inactive for a specified duration is performed by the clock signal detector 141. In particular, the receipt of a logic 0 power down signal POFF (indicating normal operating mode) by the inverter 235 of FIG. 2 causes NMOS pull-down transistor 233 to turn on. The turn on of NMOS pull-down transistor 233 causes an internal oscillator 201 to turn on and drive an input of NOR gate 211 with a oscillating signal (e.g., pulse train) having a predetermined frequency. If node N1 is at a logic 0 potential, then the oscillating signal will be passed (out of phase) to an input of a first latch 251. The first through fifth latches 251–255 collectively form a counter 221. Then, if the clock signal CLK becomes inactive at a logic 0 potential, the reset inputs of the latches will not be triggered and the counter will count upwards until a logic 1 potential is generated at node N1. Here, the period T1 of the signal at node N1 equals $T \times 2^{N-1}$, where T is the period of the oscillator and N is the number of serially-connected latches in the counter 221. As illustrated by FIG. 3, the time period tCC is a function of the phase difference between the clock signal CLK and the signal at the output of the oscillator 201 and the number N of latches in the counter 221. In particular, after the clock signal CLK transitions from 1→0 (and then remains inactive at a logic 0 potential for a duration greater than tCC), the counter 221 will begin to count up as the output of the NOR gate 211 oscillates, until node N1 transitions to a logic 1 potential (and prevents the output of NOR gate 211 from oscillating further). Then, in response to a logic 1 potential at node N1, node B (see, FIG. 1) switches to a logic 1 potential and causes the control circuits 161–165 to switch the buffers 171–175 to their standby modes. Accordingly, the memory device of FIG. 1 can be switched to a power saving standby mode whenever the power down signal POFF switches to a logic 1 potential, whenever the power voltage detection signal PVCCH switches to a logic 0 potential, or whenever the clock signal remains in an inactive state (e.g., logic 0 state) for a duration tCC or greater, where the minimum duration of tCC (e.g., 1 $\mu$s) must be greater than $T_{CLK}/2$, where $T_{CLK}$ is the period of the clock signal CLK. Power savings can therefore be achieved automatically by monitoring whether the clock is active or not.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
   at least one buffer having active and inactive modes; and
   means, responsive to a power down signal and clock signal, for disposing said at least one buffer in its inactive mode whenever the power down signal is in a first logic state or whenever the power down signal is in a second logic state at a point in time when the clock signal has continuously been in an inactive state for a duration greater than its period.

2. The integrated circuit memory device of claim 1, wherein the memory device is powered by a power supply signal; and wherein said means for disposing said at least one buffer in its inactive mode is also responsive to a power voltage detection signal and comprises means for disposing said at least one buffer in its inactive mode if the power voltage detection signal indicates that a magnitude of the power supply signal is below a first threshold.

3. The integrated circuit memory device of claim 1, wherein said means for disposing said at least one buffer in its inactive mode comprises means for disposing said at least one buffer in its inactive mode whenever the power down signal is in a second logic state at a point in time when the clock signal has continuously in an inactive state for a duration greater than twice its period.

4. The integrated circuit memory device of claim 3, wherein said means for disposing said at least one buffer in its inactive mode comprises N serially-connected latches, where N is an integer; and wherein the latches have reset inputs which are triggered whenever the clock signal transitions from the inactive state to an active state.

5. The integrated circuit memory device of claim 1, wherein said means for disposing said at least one buffer in its inactive mode comprises means for disposing said at least one buffer in its inactive mode whenever the power down signal has been in a second logic state continuously from a point in time when the clock signal transitioned from an active state to an inactive state and remained continuously in the inactive state for a duration greater than twice its period.

6. An integrated circuit memory device, comprising:
   at least one buffer having an active mode and an inactive standby mode; and
   a standby current control circuit which disposes said at least one buffer in its inactive standby mode whenever a power down signal is in a first logic state or whenever the power down signal is in a second logic state at a point in time when a clock signal has continuously been in an inactive state for a duration greater than twice its period.

7. The integrated circuit memory device of claim 6, wherein said standby current control circuit comprises a clock signal detector having N serially-connected latches therein which are reset whenever the clock signal transitions from the inactive state to an active state.

8. The integrated circuit memory device of claim 7, wherein said clock signal detector is responsive to the power down signal and comprises an oscillator which is active whenever the power down signal is in the second logic state and inactive whenever the power down signal is in the first logic state.

9. The integrated circuit memory device of claim 8, further comprising a NOR gate, said NOR gate having a first input electrically coupled to an output of the oscillator, a second input electrically coupled to an output of one of the N serially-connected latches and an output electrically coupled to an input of another of the N serially-connected latches.

10. The integrated circuit memory device of claim 7, wherein said at least one buffer comprises an address strobe buffer, a data buffer and a clock buffer.

11. The memory device of claim 6, wherein the memory device is powered by a power supply signal; and wherein said standby current control circuit; and wherein said standby current control circuit disposes said at least one buffer in its inactive mode if the power voltage detection signal indicates that a magnitude of the power supply signal is below a first threshold.

12. An integrated circuit memory device, comprising:

at least one buffer having an active mode and an inactive standby mode; and a standby current control circuit which disposes said at least one buffer in its inactive standby mode whenever a power down signal is in a first logic state or whenever the power down signal is in a second logic state at a point in time when a normally periodic control signal has continuously been in an inactive state for a duration greater than twice its period.

13. The integrated circuit memory device of claim 12, wherein said standby current control circuit comprises a clock signal detector having N serially-connected latches therein which are reset whenever the normally periodic control signal transitions from the inactive state to an active state.

14. The integrated circuit memory device of claim 13, wherein said clock signal detector is responsive to the power down signal and comprises an oscillator which is active whenever the power down signal is in the second logic state and inactive whenever the power down signal is in the first logic state.

15. The integrated circuit memory device of claim 14, further comprising a NOR gate, said NOR gate having a first input electrically coupled to an output of the oscillator, a second input electrically coupled to an output of one of the N serially-connected latches and an output electrically coupled to an input of another of the N serially-connected latches.

16. The integrated circuit memory device of claim 13, wherein said at least one buffer comprises an address strobe buffer, a data buffer and a clock buffer.

17. The integrated circuit memory device of claim 12, wherein the memory device is powered by a power supply signal; and wherein said standby current control circuit; and wherein said standby current control circuit disposes said at least one buffer in its inactive mode if the power voltage detection signal indicates that a magnitude of the power supply signal is below a first threshold.

18. An integrated circuit device having an active mode which is responsive to a clock signal and an inactive power saving standby mode, comprising:

a standby current control circuit which disposes the integrated circuit device in the inactive power saving standby mode whenever a power down signal is in a first logic state or whenever the power down signal is in a second logic state at a point in time when the clock signal has continuously been in an inactive state for a duration greater than twice its period.

19. A method of operating an integrated circuit memory device, comprising the steps of:

disposing the memory device in a power saving standby mode of operation if a power down signal is in a first logic state; and disposing the memory device in a power saving standby mode of operation if the power down signal is in a second logic state, opposite the first logic state, and an external clock signal supplied thereto has continuously been in an inactive state for a duration greater than twice its period.

* * * * *